(12) United States Patent
Matsui et al.

(10) Patent No.: US 8,302,843 B2
(45) Date of Patent: Nov. 6, 2012

(54) PROCESS FOR PRODUCING SEMICONDUCTOR DEVICE AND APPARATUS THEREFOR

(75) Inventors: Hiroyuki Matsui, Kawasaki (JP); Yutaka Makino, Kawasaki (JP); Yoshito Akutagawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/412,970

(22) Filed: Mar. 27, 2009

(65) Prior Publication Data

US 2009/0184156 A1 Jul. 23, 2009

Related U.S. Application Data

(63) Continuation of application No. PCT/JP2006/319586, filed on Sep. 29, 2006.

(51) Int. Cl.
*B23K 31/02* (2006.01)
(52) U.S. Cl. ............ 228/233.2; 228/102; 228/220
(58) Field of Classification Search .......... 228/203, 228/102, 233.2, 220
See application file for complete search history.

(56) References Cited

U.S. PATENT DOCUMENTS

| 4,833,301 | A | * | 5/1989 | Furtek | 219/388 |
| 5,532,612 | A | * | 7/1996 | Liang | 324/760 |
| 6,344,407 | B1 | | 2/2002 | Matsuki et al. | |
| 2002/0076909 | A1 | * | 6/2002 | Matsuki et al. | 438/612 |
| 2006/0202001 | A1 | * | 9/2006 | Birchall et al. | 228/264 |

FOREIGN PATENT DOCUMENTS

| JP | 07-164141 A | 6/1995 |
| JP | 08-155675 A | 6/1996 |
| JP | 11-097448 A | 4/1999 |
| JP | 2001-244283 A | 9/2001 |
| JP | 2002-210555 A | 7/2002 |
| JP | 2004-200420 A | 7/2004 |

OTHER PUBLICATIONS

Notification of Transmittal of Translation of the International Preliminary Report on Patentability (Form PCT/IB/338) of International Applicatrion No. PCT/JP2006/319586 mailed dated Apr. 9, 2009 with Forms PCT/IB/373 and PCT/ISA/237.
International Search Report for PCT/JP2006/319586, Mailing Date of Dec. 26, 2006.

* cited by examiner

*Primary Examiner* — Nicholas D'Aniello
(74) *Attorney, Agent, or Firm* — Fujitsu Patent Center (57) ABSTRACT

A process for producing a semiconductor device, includes: first melting by heating only a superior portion of a bump formed on an electrode on one principle surface of a semiconductor substrate; and second melting the entire bump by also heating an inferior portion of the bump.

5 Claims, 13 Drawing Sheets

↓ WAFER IS TAKEN OUT

PROCESS FOR PRODUCING SEMICONDUCTOR DEVICE AND APPARATUS THEREFOR

FIELD

The present embodiment relates to a process for producing a semiconductor device and an apparatus.

BACKGROUND

Conventionally, in order to reflow bumps each provided on a plurality of electrodes formed on a front surface of a substrate such as, for instance, solder bumps when producing semiconductor devices and electronic components, the substrate is placed in the interior of a heat treatment chamber and heated from a rear surface thereof so that the bumps are melted and reflowed.

Japanese Laid-open Patent Publication No. 2002-210555 and Japanese Laid-open Patent Publication No. 7-164141 disclose a technique for introducing formic acid or the like into the interior of a heat treatment chamber in order to reduce and remove an oxide film formed on a surface of a bump at the time of reflow processing.

In recent years, further miniaturization and high integration of semiconductor devices and electronic components have been developed, and according to this, a distance between electrodes on a front surface of a substrate, namely, a distance between solder bumps is required to be reduced. There arise problems as follows due to the reduction in the distance between the bumps.

Figure 7A:
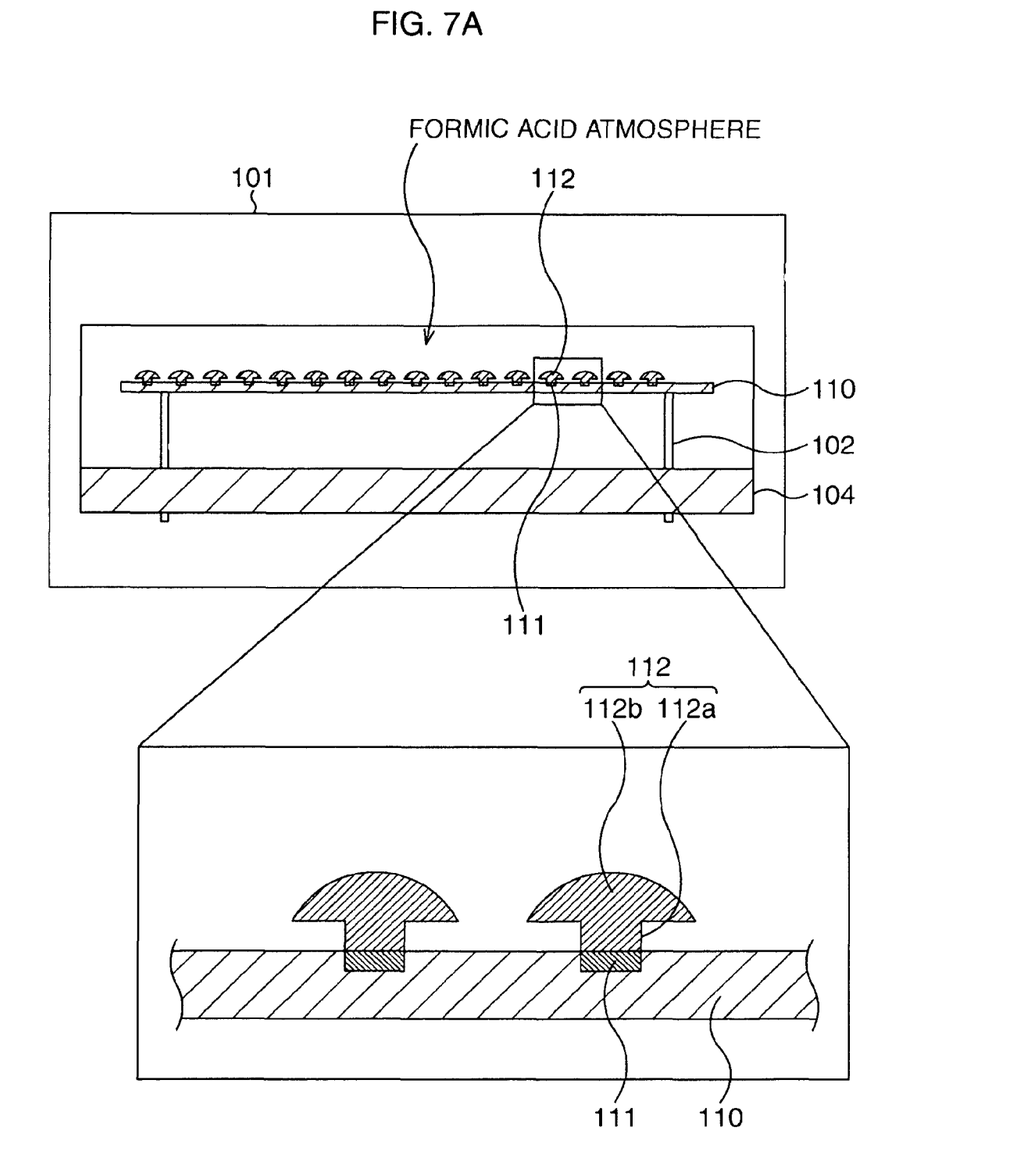
FIG. 7A is a schematic view for explaining a problem of a conventional reflow processing technique of solder bumps.
Figure 7B:
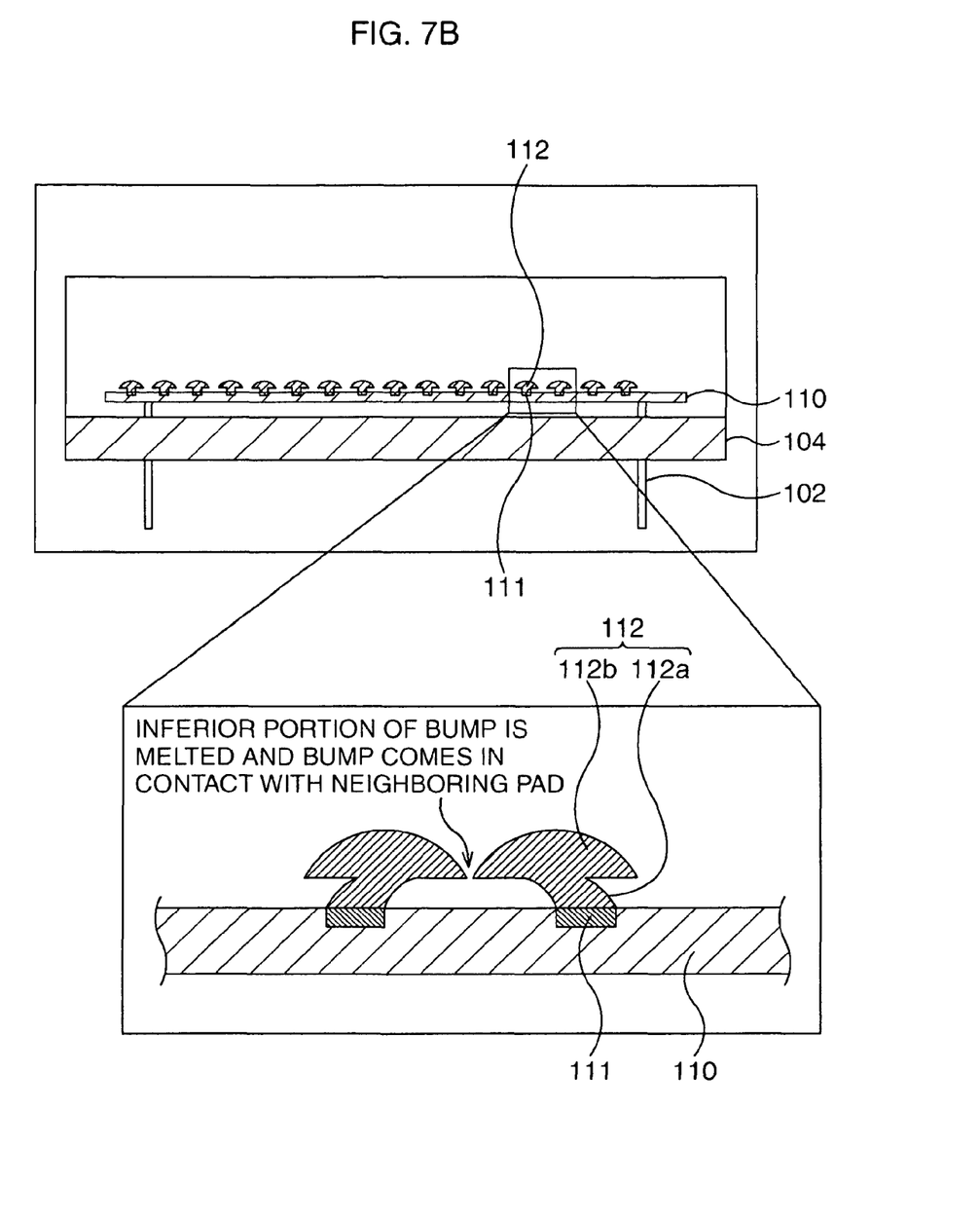
FIG. 7B is a schematic view for explaining the problem of the conventional reflow processing technique of solder bumps following FIG. 7A.
Figure 7C:
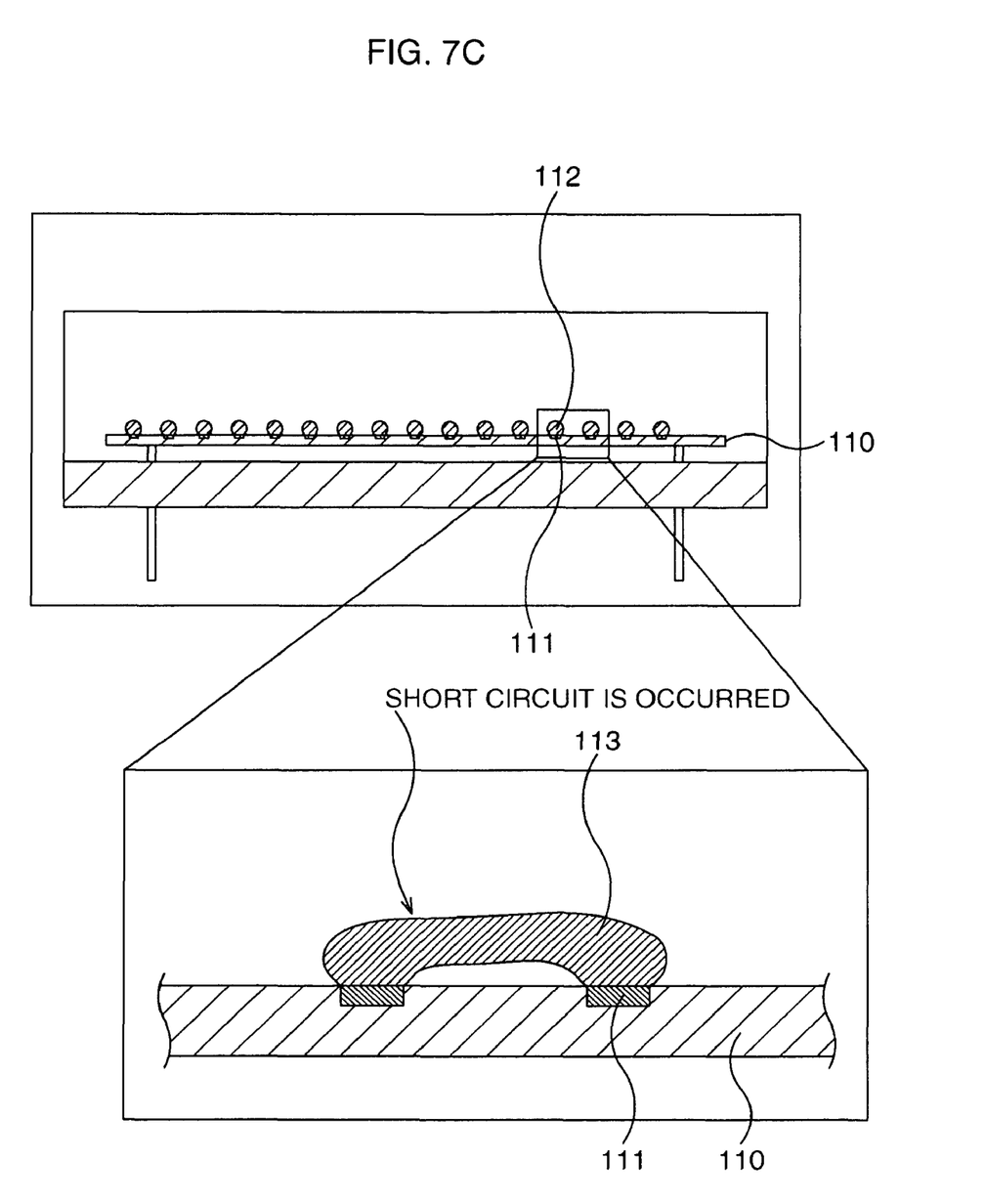
FIG. 7C is a schematic view for explaining the problem of the conventional reflow processing technique of solder bumps following FIG. 7B.

FIG. 7A to FIG. 7C are schematic views for explaining a problem of a conventional reflow processing technique of solder bumps. In FIG. 7A to FIG. 7C, an upper drawing and a lower drawing respectively illustrate a state in the interior of a heat treatment chamber and a state in which solder bumps in a rectangular frame in the upper drawing are enlarged.

First, as illustrated in the upper drawing of FIG. 7A, a semiconductor wafer 110 having solder bumps 112 each provided on a plurality of electrode terminals 111 formed on a front surface thereof is placed on support pins 102 in the interior of a heat treatment chamber 101. Here, a case is illustrated where the solder bump 112 is formed in a so-called overhang shape in which its superior portion (umbrella-shaped portion) 112b is larger than its inferior portion 112a (bottom portion) using, for instance, a plating method.

Next, a reducing gas, which is formic acid in this case, is introduced into the interior of the heat treatment chamber 101, and the interior of the heat treatment chamber 101 is heated at given temperature not lower than a reducing temperature of a surface oxide film (not illustrated) formed on a surface of the solder bump 112 and not higher than a melting temperature of the solder bump 112 by a heater 104 disposed at a lower portion in the interior of the heat treatment chamber 101, namely, at a place at which it faces a rear surface of the semiconductor wafer 110. At this time, the surface oxide film is removed and a surface of the solder bump 112 is in a state of being exposed, as illustrated in the lower drawing of FIG. 7A.

Subsequently, as illustrated in the upper drawing of FIG. 7B, a substrate moving mechanism (not illustrated) drives the support pins 102 in a longitudinal direction so that the support pins 102 are moved downward to be approximated to the heater 104. Under this state, the heater 104 heats the semiconductor wafer 110 from its rear surface at given temperature not lower than the melting temperature of the solder bump 112. Since the solder bump 112 is heated from below in this heat treatment, a timing at which the melting starts is different between the inferior portion 112a and the superior portion 112b of the solder bump 112, and the melting is precedently started from the inferior portion 112a.

At this time, when a separation distance between neighboring solder bumps 112 is small, the neighboring solder bumps 112 come in contact at the superior portions 112b, as illustrated in the lower drawing of FIG. 7B. This is caused by a lean and fall of the solder bumps 112 due to a thermal vibration or the like since a solder viscosity of the inferior portion 112a is lowered by the above heating yet the superior portion 112b is close to an unmelting state. When the separation distance between the neighboring solder bumps 112 is relatively large, the contact between the neighboring solder bumps 112 does not occur even if the solder bumps 112 are leaned, but, as the separation distance becomes smaller, a probability of contact becomes higher.

The once contacted solder bumps 112 maintain the contacted state even being completely melted by the above heating. Accordingly, there is a problem that a bridge 113 is formed between the contacted solder bumps 112 and a short circuit is occurred, as illustrated in FIG. 7C.

SUMMARY

According to an aspect of the embodiment, a substrate processing process includes: first melting by heating only a superior portion of a bump formed on an electrode on one principle surface of a semiconductor substrate; and second melting the entire bump by also heating an inferior portion of the bump.

According to another aspect of the embodiment, an apparatus for producing a semiconductor device of the present embodiment includes: a first heating unit provided at an upper portion in the interior of a chamber; and a second heating unit provided at a lower portion in the interior of the chamber.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DETAILED DESCRIPTION OF THE PREFERRED EMBODIMENTS

Basic Gist of the Present Embodiment

The present inventor has paid attention to the fact that a short circuit between neighboring bumps at the time of reflow of the bumps is occurred because the bumps are heated from below, and has come up with the present embodiment. In the present embodiment, at the time of reflow, a superior portion of a bump is first heated at given temperature not lower than a melting temperature of the bump so that the melting is precedently started from the superior portion. Subsequently, an inferior portion of the bump is heated at given temperature not lower than the melting temperature of the bump, to thereby melt the inferior portion. At this time, the superior portion of the bump is in a state of having already started melting with a solder viscosity lowered, so that when the inferior portion melts, the bump attains substantially homogeneous melting without bias, taking a substantially spherical (or semispherical) stable configuration. Therefore, even when a thermal vibration or the like occurs, as the stable configuration is accomplished, there is no apprehension of lean, fall, etc. of the bump, and the respective bumps attain desired and good reflow condition without short circuiting between those neighboring to each other.

Further, the present inventor has come up with a concrete configuration of an apparatus for producing a semiconductor device realizing the above heat treatment. In order to freely perform respective heat treatments on a superior portion and on an inferior portion of a bump, the apparatus for producing the semiconductor device of the present embodiment adopts a configuration in which a first heating unit facing a front surface of a substrate and a second heating unit facing a rear surface of the substrate are respectively disposed in the interior of a heat treatment chamber, and each of the respective heating units can independently or simultaneously perform heat control.

Furthermore, in the apparatus for producing the semiconductor device of the present embodiment, a substrate moving unit relatively moving the substrate with respect to the first heating unit or the second heating unit is disposed. With this configuration, a position of the substrate can be adjusted so that when either of the front surface and the rear surface of the substrate is heated, the other one is not affected by the heating.

Preferred Embodiment to which Present Embodiment is Applied

Figure 1:
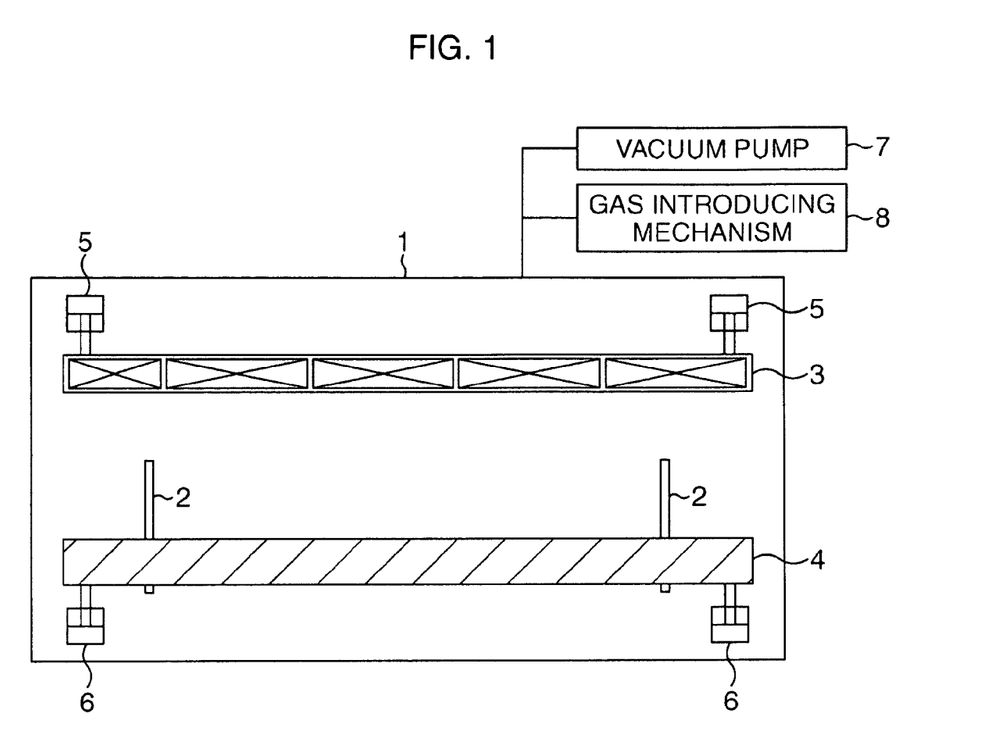
FIG. 1 is a schematic view illustrating a schematic configuration of an apparatus for producing a semiconductor device according to the present embodiment.

FIG. 1 is a schematic view illustrating a schematic configuration of an apparatus for producing a semiconductor device according to the present embodiment.

The apparatus for producing the semiconductor device is configured by being provided with a heat treatment chamber 1 housing a substrate to be an object to be processed, which is a semiconductor wafer in this case, support pins 2 supporting the substrate housed in the heat treatment chamber 1, an upper heater 3 and a lower heater 4 being heating units, moving mechanisms 5 and 6 respectively moving the upper heater 3 and the lower heater 4, a vacuum pump 7 evacuating the interior of the heat treatment chamber 1, and a gas introducing mechanism 8 introducing an atmosphere gas into the interior of the heat treatment chamber 1.

The support pins 2 support the semiconductor wafer at outer peripheral portions thereof, and four support pins 2 are arranged here (only two pins are depicted in the illustrated example). By these four support pins 2, the semiconductor wafer is uniformly supported and fixed. The support pins 2 penetrate inside the lower heater 4, and are provided with moving mechanisms (not illustrated) moving the support pins 2 in a longitudinal direction with respect to the lower heater 4.

The upper heater 3 is, for instance, an infrared lamp heater or the like provided at an upper portion, namely, at a side of a front surface (face on which solder bumps are provided) of the disposed semiconductor wafer in the interior of the heat treatment chamber 1, and is provided with a heat control mechanism (not illustrated) with which a heating temperature and a heating time of the upper heater 3 are freely controlled to be desired ones.

The lower heater 4 is, for instance, an infrared lamp heater or the like provided at a lower portion, namely, at a side of a rear surface (face on which solder bumps are not provided) of the disposed semiconductor wafer in the interior of the heat treatment chamber 1, and is provided with a heat control mechanism (not illustrated) with which a heating temperature and a heating time of the lower heater 4 are freely controlled to be desired ones.

Note that the upper heater 3 and the lower heater 4 adopt configurations in which they can respectively independently or simultaneously (cooperatively) perform heat control.

The moving mechanism 5 freely moves the upper heater 3 in the longitudinal direction with respect to the front surface of the disposed semiconductor wafer, and in this case, it is configured by being provided with an air cylinder.

The moving mechanism 6 freely moves the lower heater 4 in the longitudinal direction with respect to the rear surface of the disposed semiconductor wafer, and in this case, it is configured by being provided with an air cylinder.

The respective moving mechanism 5 and moving mechanism 6 can be independently operated (the upper heater 3 and the lower heater 4 can be independently move-controlled by the mechanisms). In the present embodiment, in addition to the independent operating function, both the mechanisms cooperate to drive the upper heater 3 and the lower heater 4 so that a separation distance between a first heater 3 and a second heater 4 is kept constant at about 30 mm, for instance. By adopting this configuration, when the front surface of the substrate is heated by the upper heater 3, for instance, it is not affected by the heating from the lower heater 4.

The gas introducing mechanism 8 introduces a reducing gas, which is, for instance, a predetermined amount of formic acid gas, into the interior of the heat treatment chamber 1 in order to remove an oxide film formed on a surface of the bump before reflow processing on the bump is conducted.

Hereinafter, a processing process using the apparatus for producing the semiconductor device in FIG. 1 will be described.

FIG. 2A to FIG. 2D are schematic sectional views illustrating a process for forming solder bumps used in the present embodiment in sequence of process steps. FIG. 3A to FIG. 5B are schematic views illustrating a substrate processing process according to the present embodiment in sequence of process steps. Here, in FIG. 3C and FIG. 4A to FIG. 4C, an upper drawing and a lower drawing respectively illustrate a state in the interior of a heat treatment chamber and a state in which solder bumps in a rectangular frame in the upper drawing are enlarged.

At the beginning, solder bumps are formed on a front surface of a semiconductor wafer.

Figure 2A:
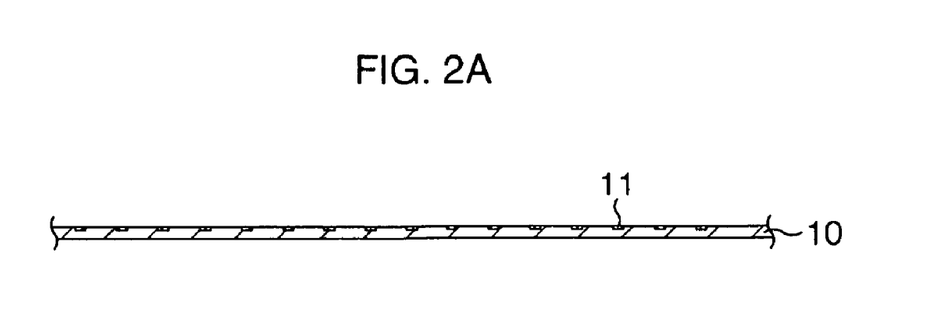
FIG. 2A is a schematic sectional view illustrating a process for forming solder bumps used in the present embodiment in sequence of process steps.

First, as illustrated in FIG. 2A, there is prepared a semiconductor wafer (silicon wafer) 10 in which semiconductor elements such as transistors and semiconductor memories are formed and a plurality of electrode terminals 11 to be externally connected to these semiconductor elements are formed on front surfaces thereof.

Figure 2B:
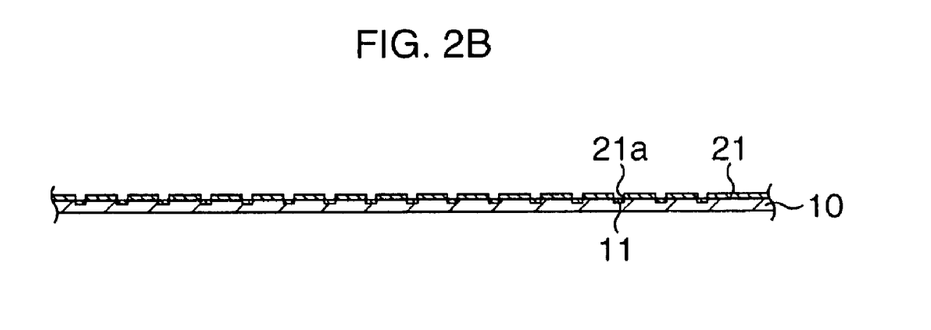
FIG. 2B is a schematic sectional view illustrating the process for forming solder bumps used in the present embodiment in sequence of process steps following FIG. 2A.

Subsequently, as illustrated in FIG. 2B, a plating seed layer (not illustrated) and a resist film are coated and formed so as to cover a front surface of the semiconductor wafer 10 and the resist film is processed by lithography, to thereby form a resist mask 21 having openings 21a from which each of the electrode terminals 11 is exposed in a state where the plating seed layer is formed on a surface thereof.

Figure 2C:
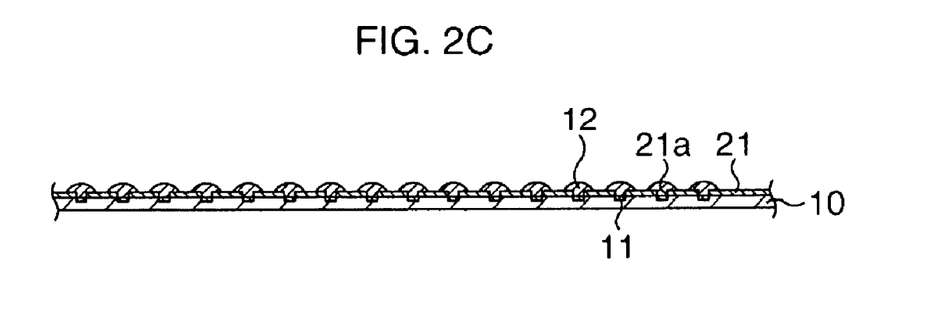
FIG. 2C is a schematic sectional view illustrating the process for forming solder bumps used in the present embodiment in sequence of process steps following FIG. 2B.

Subsequently, as illustrated in FIG. 2C, a solder, which is an SnAg-based solder in this case, is plating-deposited on the plating seed layer exposed from the openings 21a of the resist mask 21 by using, for instance, an electrolytic plating method, to thereby form solder bumps 12 each connected to the respective electrode terminals 11.

The solder bump 12 is formed in a shape capable of obtaining a predetermined height after being reflowed, here, it is formed so that its height becomes greater than a thickness of the resist mask 21, namely, a superior portion of the solder bump 12 protrudes from a surface of the resist mask 21. More concretely, the solder bump 12 is formed in an umbrella shape in which the superior portion is larger than an inferior portion (portion inside the opening 21a in which the plating is filled).

Further, as a plating material of the solder bump 12, an SnAgCu-based solder or a PbSn-based solder may also be used instead of the SnAg-based solder.

Figure 2D:
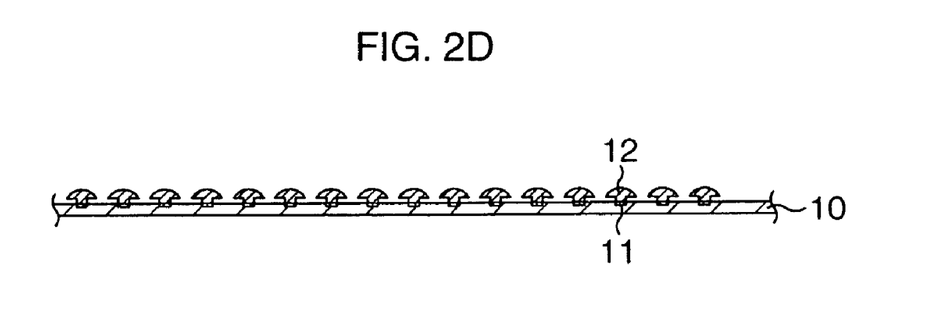
FIG. 2D is a schematic sectional view illustrating the process for forming solder bumps used in the present embodiment in sequence of process steps following FIG. 2C.

Subsequently, as illustrated in FIG. 2D, the resist mask 21 is removed by ashing or the like, and the plating seed layer under the resist mask 21 is removed by using predetermined chemicals. By going through the above-described steps, the semiconductor wafer 10 is made to be in a state where each of the solder bumps 12 is formed on the respective electrode terminals 11 on the front surface thereof. At this time, a pitch and a size of the solder bumps 12 formed in parallel are respectively about 200 μm and about 180 μm, for instance.

Next, reflow processing is performed on the respective solder bumps 12 of the semiconductor wafer 10.

Figure 3A:
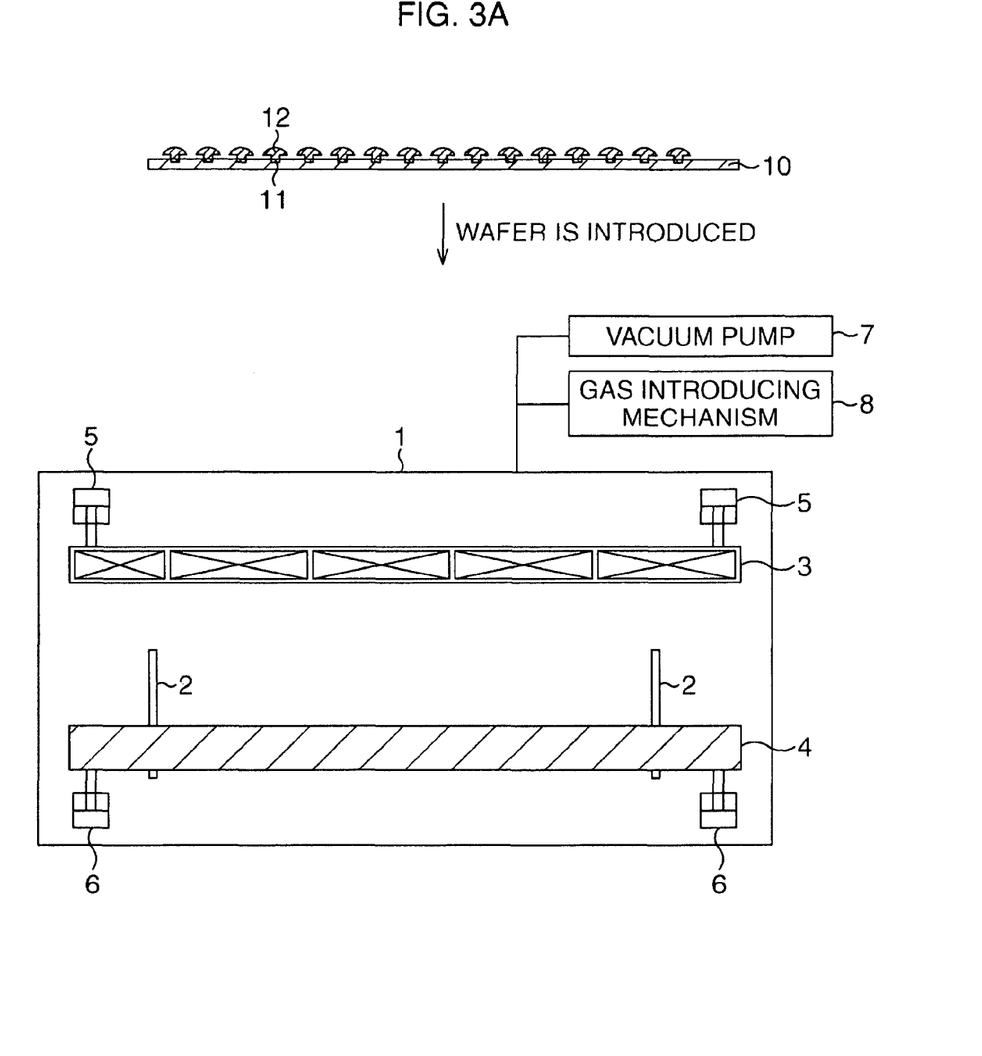
FIG. 3A is a schematic view illustrating a substrate processing process according to the present embodiment in sequence of process steps.

First, as illustrated in FIG. 3A, the semiconductor wafer 10 in a state where each of the solder bumps 12 is formed on the respective electrode terminals 11 on the front surface thereof is introduced into the interior of the heat treatment chamber 1 of the apparatus for producing the semiconductor device in FIG. 1.

Figure 3B:
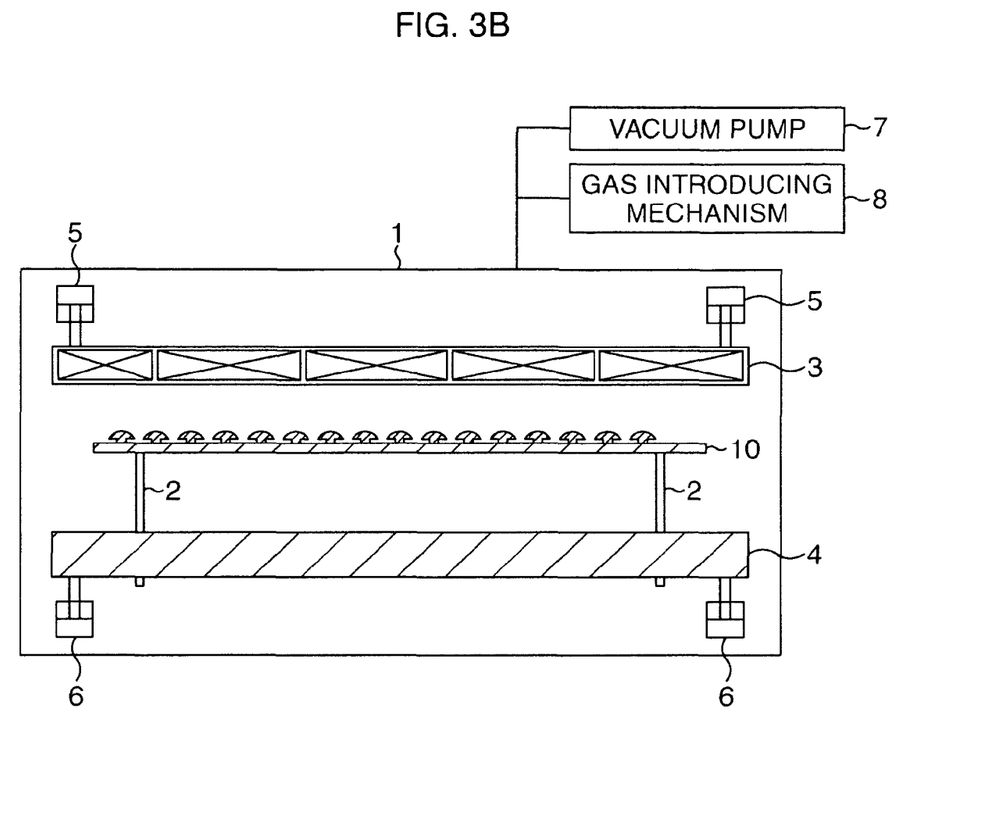
FIG. 3B is a schematic view illustrating the substrate processing process according to the present embodiment in sequence of process steps following FIG. 3A.

FIG. 3B illustrates a state where the semiconductor wafer 10 is introduced into the interior of the heat treatment chamber 1 and is supported and fixed by the support pins 2 at outer peripheral portions thereof.

Figure 3C:
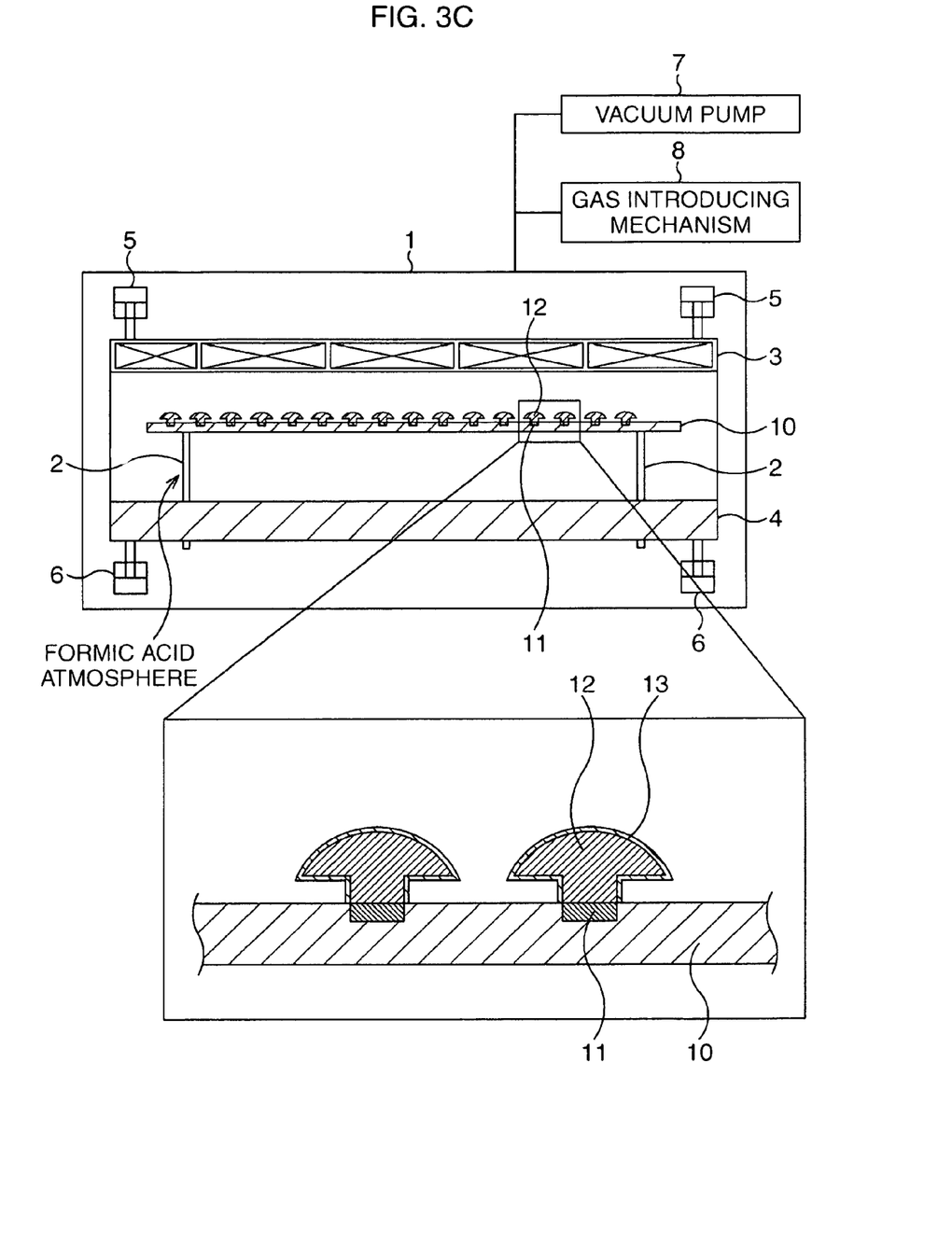
FIG. 3C is a schematic view illustrating the substrate processing process according to the present embodiment in sequence of process steps following FIG. 3B.

Here, as illustrated in the lower drawing of FIG. 3C, a surface of the solder bump 12 is in a state where an oxide film 13 is formed thereon due to natural oxidation or the like. In the present embodiment, the oxide film 13 is removed in the following manner prior to the reflow processing.

First, the interior of the heat treatment chamber 1 is made to be a predetermined vacuum state by driving the vacuum pump 7, and thereafter, a reducing gas, which is a predetermined amount of formic acid gas in this case, is introduced into the interior of the heat treatment chamber 1 by the gas introducing mechanism 8, as illustrated in the upper drawing of FIG. 3C. When introducing the formic acid gas, an atmospheric temperature of the heat treatment chamber 1 is adjusted to a temperature lower than a melting temperature of the solder bump 12 and in the vicinity of a reduction starting temperature of the oxide film 13 (about ±5° C. of the reduction starting temperature), which is, for instance, about 170° C.

Subsequently, as illustrated in the upper drawing of FIG. 4A, the respective solder bumps 12 are heated from the front surface side of the semiconductor wafer 10 by heat-driving the upper heater 3. Here, the heat treatment is conducted for about 2 to 3 minutes at a temperature not lower than the reduction starting temperature of the oxide film 13 and lower than the melting temperature of the solder bump 12, which is, for instance, about 190° C. By conducting this heat treatment, the oxide film 13 is reacted with the formic acid gas to be reduced, and is removed from the surface of the solder bump 12, as illustrated in the lower drawing of FIG. 4A. Accordingly, the solder bump 12 is made to be in a state where its surface is exposed.

Figure 4A:
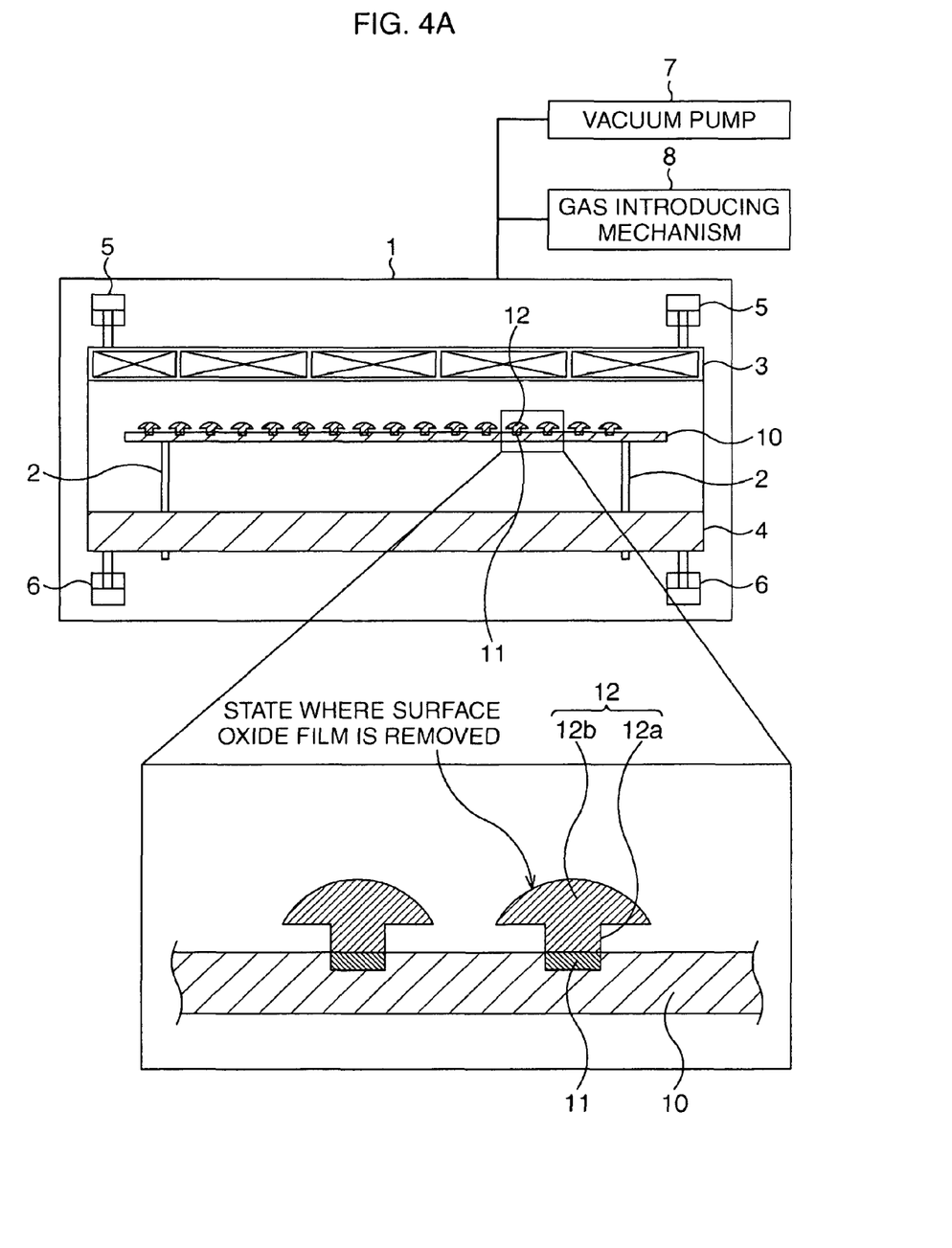
FIG. 4A is a schematic view illustrating the substrate processing process according to the present embodiment in sequence of process steps following FIG. 3C.

Note that in the upper drawing of FIG. 4A, a case is illustrated in which a separation distance between the upper heater 3 and the front surface of the semiconductor wafer 10 is adjusted to a value suitable for the heating of the respective solder bumps 12 conducted by the upper heater 3 when the semiconductor wafer 10 is supported and fixed by the support pins 2, as illustrated in FIG. 3B. Here, it is also possible to configure that the aforementioned separation distance is adjusted so that it takes a value suitable for the heating of the respective solder bumps 12 conducted by the upper heater 3 by moving the upper heater 3 using the moving mechanism 5 at the time of the heat treatment.

Figure 4B:
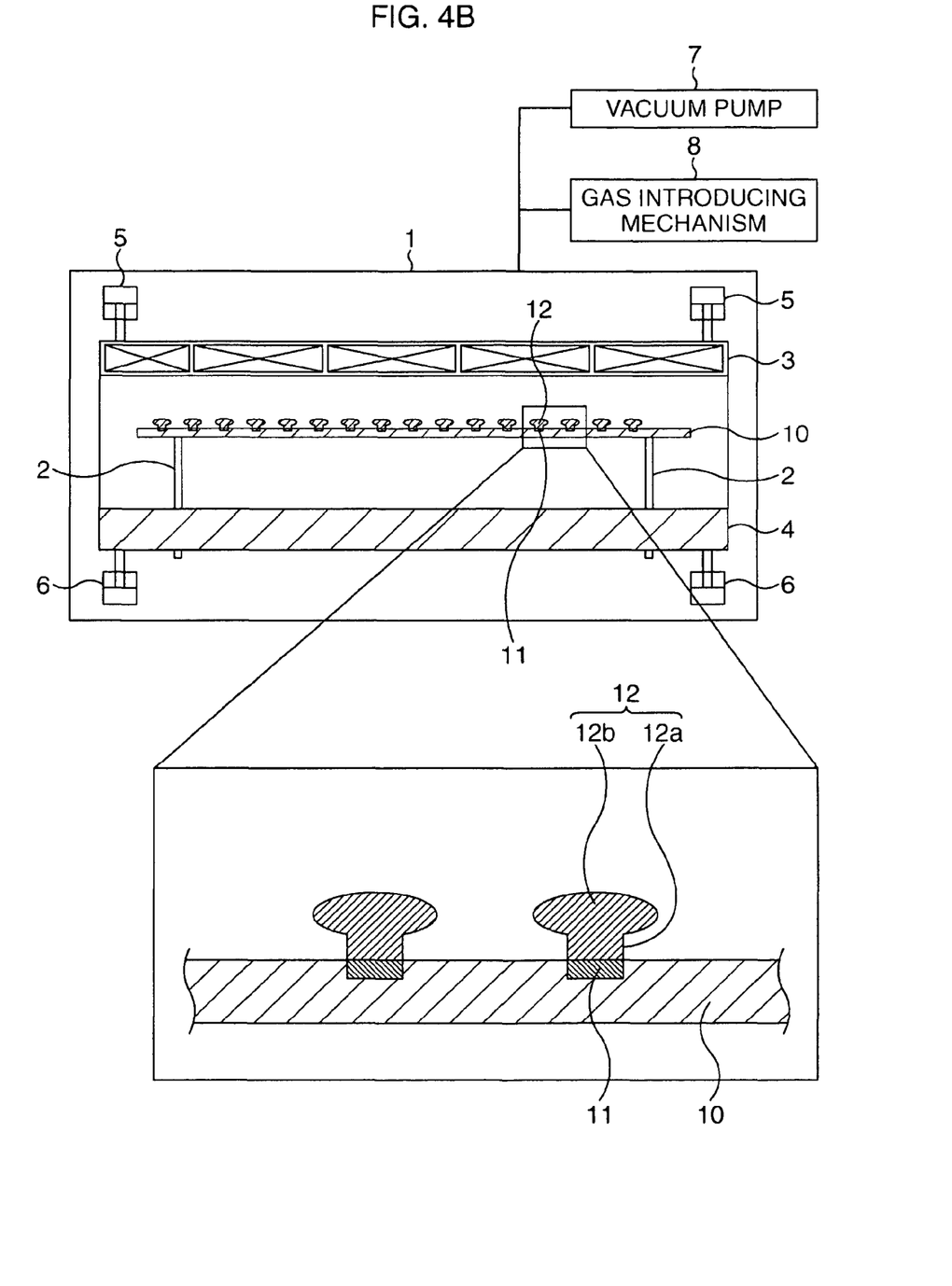
FIG. 4B is a schematic view illustrating the substrate processing process according to the present embodiment in sequence of process steps following FIG. 4A.

Subsequently, as illustrated in the upper drawing of FIG. 4B, a temperature of the upper heater 3 is elevated, and the respective solder bumps 12 are continuously heated from the front surface side of the semiconductor wafer 10. Here, the heat treatment is conducted for 1 minute or longer at a temperature not lower than the melting temperature of the solder bump 12, which is, for instance, about 270° C. By conducting this heat treatment, a superior portion (umbrella-shaped portion) 12b of each of the solder bumps 12 is melted in preference to (prior to) an inferior portion 12a (bottom portion), as illustrated in the lower drawing of FIG. 4B.

Subsequently, as illustrated in the upper drawing of FIG. 4C, the lower heater 4 is moved by the moving mechanism 6 so as to be approximated to a rear surface of the semiconductor wafer 10 (in the longitudinal direction), and a separation distance between the lower heater 4 and the rear surface of the semiconductor wafer 10 is adjusted to a value suitable for the heating of the respective solder bumps 12 conducted by the lower heater 4. Here, when the lower heater 4 is moved by the moving mechanism 6, the moving mechanism 5 operates by cooperating with the moving mechanism 6, and the upper heater 3 is moved by the moving mechanism 5 so as to be distant from the front surface of the semiconductor wafer 10 (in the longitudinal direction) so that the separation distance between the upper heater 3 and the lower heater 4 is kept constant at, for instance, 30 mm.

Subsequently, the respective solder bumps 12 are heated from the rear surface side of the semiconductor wafer 10 by heat-driving the lower heater 4. Here, the heat treatment is conducted for 1 minute or longer at a temperature not lower than the melting temperature of the solder bump 12, which is, for instance, about 270° C. In this case, the heat treatment by the upper heater 3 may also be continued appropriately. Since the separation distance between the upper heater 3 and the lower heater 4 is kept constant as described above, it is possible to prevent the superior portion 12b of each of the solder bumps 12 from being excessively heated by the upper heater 3.

Figure 4C:
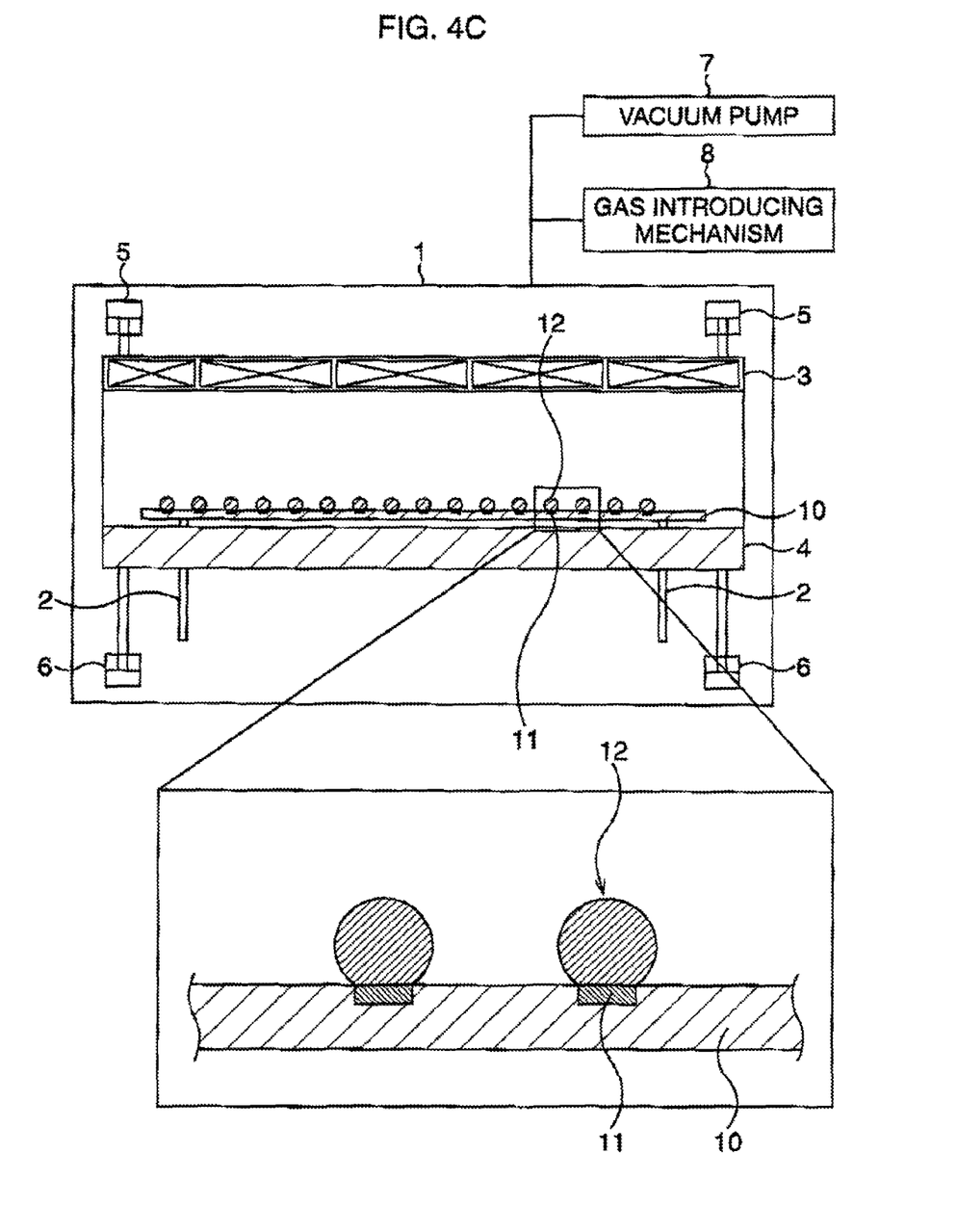
FIG. 4C is a schematic view illustrating the substrate processing process according to the present embodiment in sequence of process steps following FIG. 4B.

By conducting this heat treatment, the inferior portion (bottom portion) 12a of each of the solder bumps 12 is melted following to the superior portion 12b, as illustrated in the lower drawing of FIG. 4C. At this time, the superior portion 12b of each of the solder bumps 12 is in a state of having already started melting with a solder viscosity lowered, so that when the inferior portion 12a melts, each of the solder bumps 12 attains substantially homogeneous melting without bias, taking a substantially spherical stable configuration, for example. Therefore, even when a thermal vibration or the like occurs, as the stable configuration is accomplished, there is no apprehension of lean, fall, etc. of each of the solder bumps 12, and the respective solder bumps 12 attain desired and good reflow condition without short circuiting between those neighboring to each other.

Figure 5A:
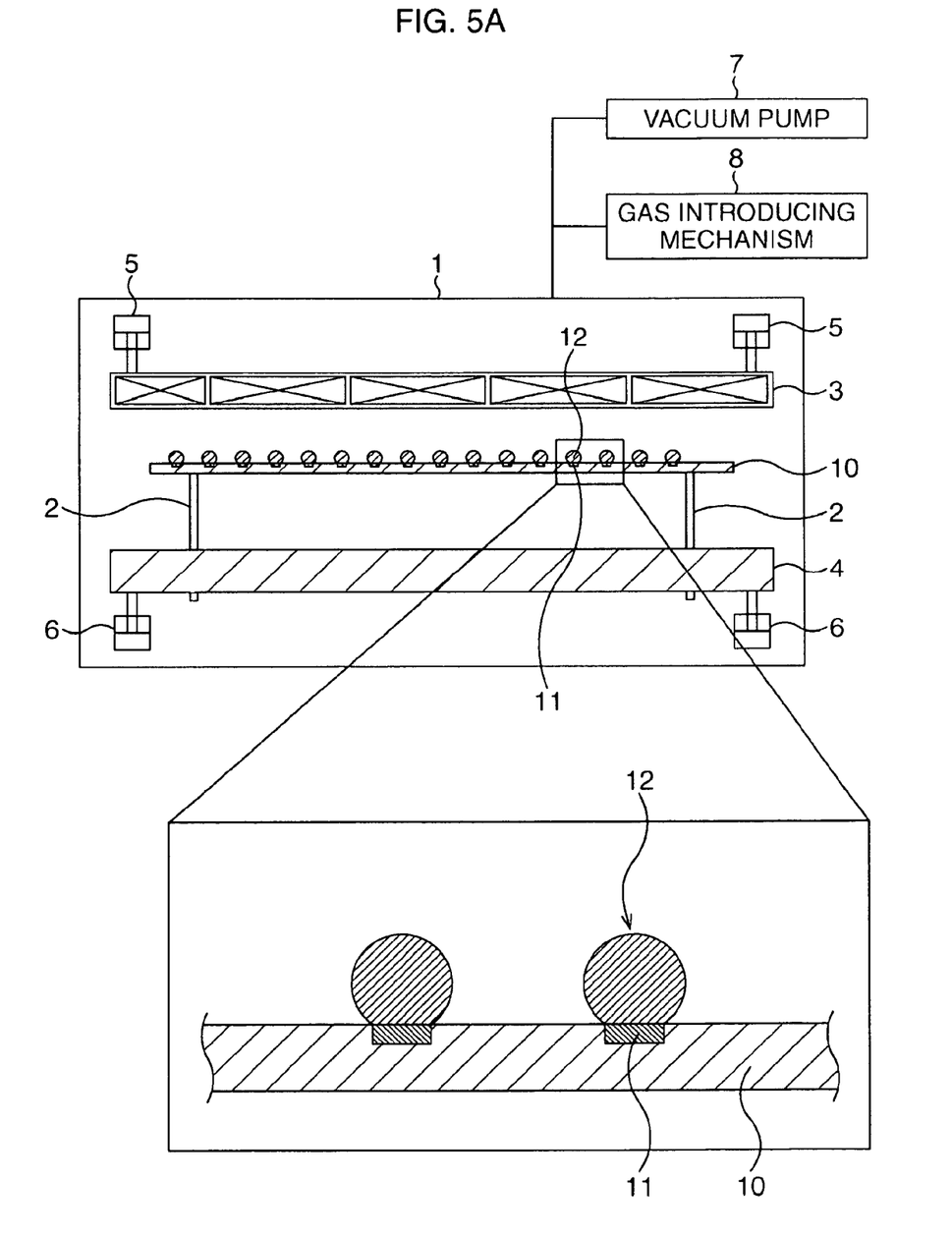
FIG. 5A is a schematic view illustrating the substrate processing process according to the present embodiment in sequence of process steps following FIG.

Subsequently, the heat-driving of the upper heater 3 and the lower heater 4 is stopped, and positions of the upper heater 3 and the lower heater 4 are returned to the initial states by the moving mechanisms 5 and 6, as illustrated in FIG. 5A. Thereafter, the formic acid gas in the interior of the heat treatment chamber 1 is discharged by driving the vacuum pump 7.

Figure 5B:
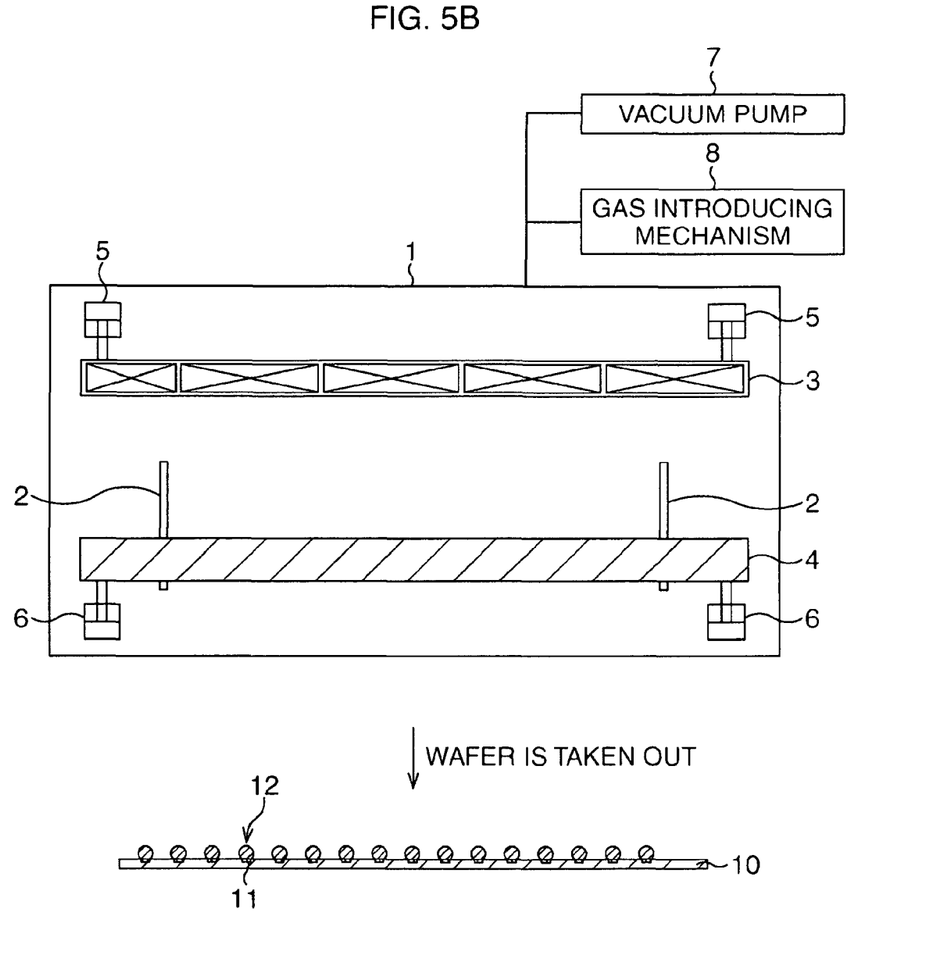
FIG. 5B is a schematic view illustrating the substrate processing process according to the present embodiment in sequence of process steps following FIG. 5A.

Subsequently, as illustrated in FIG. 5B, the semiconductor wafer 10 is taken out from the heat treatment chamber 1 to the outside. At this time, the respective solder bumps 12 of the semiconductor wafer 10 are kept in good and substantially spherical shapes at the time of reflow without short circuit or the like between those neighboring to each other.

As has been described above, according to the present embodiment, it is possible to realize a highly reliable product by realizing a good and desired bump reflow while reducing a distance between neighboring solder bumps 12 yet without short circuiting between the solder bumps 12 in order to meet a demand for further miniaturization and high integration of semiconductor devices and electronic components.

Figure 6:
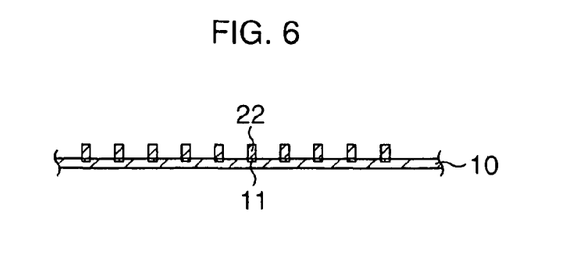
FIG. 6 is a schematic sectional view illustrating an example of another semiconductor wafer to be a processing object of the present embodiment.

Note that although the present embodiment illustrates a case where each of the solder bumps 12 of the semiconductor wafer 10 is formed in a so-called mushroom shape in which its superior portion 12b is larger than the inferior portion 12a, the present embodiment is not limited to this solder bump 12. For example, a semiconductor wafer 10 having electrode terminals 11 formed thereon on which solder bumps 22 having straight shapes (a superior portion and an inferior portion have the same shape) are formed by an electrolytic plating method as illustrated in FIG. 6 may also be a processing object.

When the straight-shaped solder bumps 22 are formed and the reflow processing is conducted by the conventional substrate processing process illustrated in FIG. 7A to FIG. 7B, there is a similar apprehension of lean, fall and short circuit of the solder bumps 12, although which is not significant. Accordingly, by applying a substrate processing process similar to the one in the present embodiment, it is possible to obtain the semiconductor wafer 10 on which the respective solder bumps 22 are formed in good and substantially spherical shapes at the time of reflow without short circuit or the like between those neighboring to each other, similar to the case of FIG. 5B, for instance.

INDUSTRIAL APPLICABILITY

According to the present embodiment, it is possible to realize a highly reliable product by realizing a good and desired bump reflow while reducing a distance between neighboring bumps yet without short circuiting between the bumps in order to meet a demand for further miniaturization and high integration of semiconductor devices and electronic components.

What is claimed is:

1. A process of producing a semiconductor device, comprising:
    first melting by heating a superior portion of a bump formed on an electrode on one principle surface of a semiconductor substrate disposed in an interior of a chamber with a first heating unit provided at an upper portion in the interior of the chamber; and
    after the first melting, approximating a second heating unit provided at a lower portion in the interior of the chamber to the other principle surface of the semiconductor substrate by a moving unit, and second melting the entire bump by heating an inferior portion of the bump with the second heating unit,
    wherein, before the first melting, the process comprises first controlling a temperature of a formic acid gas atmosphere to be lower than a melting temperature of the bump and in the vicinity of a reduction starting temperature of an oxide film; and
    subsequently to the first controlling, second controlling a temperature of the formic acid gas atmosphere to be constant for a predetermined time to be a temperature lower than the melting temperature of the bump and not lower than the reduction starting temperature of the oxide film, to remove the oxide film.

2. The process for producing the semiconductor device according to claim 1, wherein the first melting and the second melting are conducted in a formic acid gas atmosphere.

3. The process for producing the semiconductor device according to claim 1, wherein the bump is a solder bump.

4. The process for producing the semiconductor device according to claim 1, wherein the bump is formed in an overhang shape in which the superior portion is larger than the inferior portion.

5. The process for producing the semiconductor device according to claim 1, wherein the first heating unit and the second heating unit are provided with an infrared lamp heater.

* * * * *